United States Patent [19]
Shiu et al.

(10) Patent No.: US 6,867,072 B1
(45) Date of Patent: Mar. 15, 2005

(54) FLIPCHIP QFN PACKAGE AND METHOD THEREFOR

(75) Inventors: Hei Ming Shiu, Hong Kong (HK); Wai Wong Chow, Hong Kong (HK); Qing-Chun He, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/752,866

(22) Filed: Jan. 7, 2004

(51) Int. Cl.$^7$ .......................... H01L 21/48; H01L 21/50
(52) U.S. Cl. ...................................... 438/123; 438/124
(58) Field of Search ............................... 438/123, 124, 438/106

(56) References Cited

U.S. PATENT DOCUMENTS

| | | |
|---|---|---|
| 4,809,135 A | 2/1989 | Yerman |
| 4,894,752 A | 1/1990 | Murata et al. |
| 5,157,480 A | 10/1992 | McShane et al. |
| 5,172,214 A | 12/1992 | Casto |
| 5,200,362 A | 4/1993 | Lin et al. |
| 5,262,674 A | 11/1993 | Banerji et al. |
| 5,273,938 A | 12/1993 | Lin et al. |
| 5,625,235 A | 4/1997 | Takiar |
| 6,211,462 B1 | 4/2001 | Carter et al. |
| 6,376,905 B2 | 4/2002 | Hisano et al. |
| 6,396,130 B1 | 5/2002 | Crowley et al. |
| 6,501,156 B1 | 12/2002 | Nakanishi et al. |

Primary Examiner—Eddie Lee
Assistant Examiner—Douglas W. Owens
(74) Attorney, Agent, or Firm—Charles E. Bergere; Robert L. King

(57) ABSTRACT

A semiconductor device (10) includes a first leadframe (18) having a perimeter (20) that defines a cavity (22) and leads (14) extending inwardly from the perimeter, and a second leadframe (32) having top and bottom surfaces and a die paddle surrounding a die receiving area (36). An integrated circuit (12) is placed within the die receiving area of the second leadframe. The IC has bonding pads (44) located on a peripheral portion of its top surface. The second leadframe and the IC are in facing relation with the first leadframe such that the leads of the first leadframe are electrically connected to respective ones of the bonding pads. A mold compound (50) is injected between the first and second leadframes and covers the second leadframe top surface and a central area of the first surface of the IC. At least the bottom surfaces of the leads are exposed.

22 Claims, 7 Drawing Sheets

FLIPCHIP QFN PACKAGE AND METHOD THEREFOR

BACKGROUND OF THE INVENTION

The present invention relates to integrated circuits and packaged integrated circuits and, more particularly, to a packaged integrated circuit formed using two separate leadframes.

An integrated circuit (IC) die is a small device formed on a semiconductor wafer, such as a silicon wafer. A leadframe is a metal frame that usually includes a paddle that supports an IC die that has been cut from the wafer. The leadframe has lead fingers that provide external electrical connections. That is, the die is attached to the die paddle and then bonding pads of the die are connected to the lead fingers via wire bonding or flip chip bumping to provide the external electrical connections. Encapsulating the die and wire bonds or flip chip bump with a protective material forms a package. Depending on the package type, the external electrical connections may be used as-is, such as in a Thin Small Outline Package (TSOP), or further processed, such as by attaching spherical solder balls for a Ball Grid Array (BGA). These terminal points allow the die to be electrically connected with other circuits, such as on a printed circuit board.

Use of packaged ICs is widespread. Moreover, the size and cost of electronic devices puts continuous pressure on the need for small, yet less costly packaged ICs. Furthermore, for high bandwidth RF devices and high operating frequency devices, there is a push for shorter electrical paths inside the IC package. Flip chip bonding can replace the traditional wire bonding interconnection. Thus, it is desirable to provide an inexpensive method of flip chip interconnection packaging ICs. It also is desirable to have a method of decreasing the size of such packaged ICs.

BRIEF DESCRIPTION OF THE DRAWINGS

The following detailed description of a preferred embodiment of the invention, will be better understood when read in conjunction with the appended drawings. For the purpose of illustrating the invention, there is shown in the drawings an embodiment that is presently preferred. It should be understood, however, that the invention is not limited to the precise arrangement and instrumentalities shown. In the drawings.

DETAILED DESCRIPTION OF PREFERRED EMBODIMENTS

Figure 1:
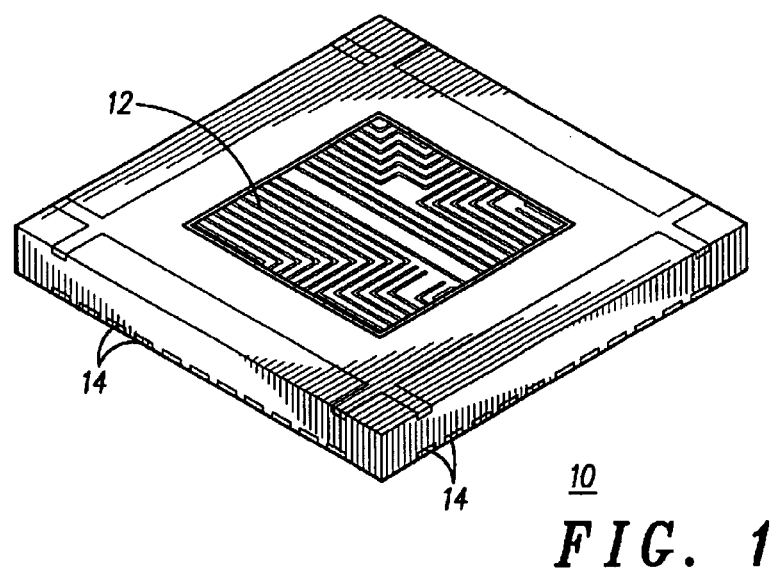
FIG. 1 is a top perspective view of a packaged semiconductor device in accordance with an embodiment of the present invention.

The detailed description set forth below in connection with the appended drawings is intended as a description of the presently preferred embodiment of the invention, and is not intended to represent the only form in which the present invention may be practiced. It is to be understood that the same or equivalent functions may be accomplished by different embodiments that are intended to be encompassed within the spirit and scope of the invention. As will be understood by those of skill in the art, the present invention can be applied to various packages and package types.

Certain features in the drawings have been enlarged for ease of illustration and the drawings and the elements thereof are not necessarily in proper proportion. Further, the invention is shown embodied in a Quad Flat No-lead (QFN) type package. However, those of ordinary skill in the art will readily understand the details of the invention and that the invention is applicable to other package types. In the drawings, like numerals are used to indicate like elements throughout.

The present invention is a semiconductor device made with two separate leadframes. The device has a first leadframe having a perimeter that defines a cavity and a plurality of leads extending inwardly from the perimeter. The second leadframe has a top surface and a bottom surface and a die paddle surrounding a die receiving area. An integrated circuit (IC) is disposed within the die receiving area of the second leadframe. The IC has a plurality of bonding pads located on a peripheral portion of its first surface. The first leadframe and the second leadframe are in facing relation such that the leads of the first leadframe are electrically connected to respective ones of the bonding pads of the IC. A mold compound is injected between the first and second leadframes and covers the second leadframe top surface and a central area of the first surface of the IC. At least the bottom surfaces of the leads are exposed.

The present invention further provides a method of packaging a semiconductor device comprising the steps of:

providing a first leadframe having a perimeter that defines a cavity and a plurality of leads extending inwardly from the perimeter, wherein the first leadframe has first and second sides;

applying a first tape to the first side of the first leadframe;

providing a second leadframe having a die paddle, the die paddle having a die receiving area, the second leadframe having top and bottom surfaces;

applying a second tape to the bottom surface of the second leadframe;

attaching an integrated circuit (IC) to the die receiving area of the die paddle, the IC having a top surface with a plurality of bonding pads around a perimeter thereof and a bottom surface, wherein if the die receiving area is a cavity, then the bottom surface of the IC is attached to the second tape inside the die paddle;

stacking the second leadframe on the first leadframe such that the plurality of IC bonding pads electrically contact respective ones of the plurality of leads of the first leadframe;

forming a mold compound over at least the top surface of the second leadframe, the top surface of the IC, and the electrical contacts; and removing the first and second tapes from the first and second leadframes so that the first side of the first leadframe and the bottom surface of the second leadframe are exposed.

The present invention further provides a method of packaging a plurality of semiconductor devices, comprising the steps of:

providing a first leadframe panel, the first leadframe panel having a plurality of first leadframes, each of the first leadframes having a perimeter that defines a cavity and a plurality of leads extending inwardly from the perimeter, wherein the first leadframe panel has first and second sides;

applying a first tape to the first side of the first leadframe panel;

providing a second leadframe panel, the second leadframe panel including a plurality of second leadframes, each of the second leadframes including a die paddle having a die receiving area, wherein the second leadframe panel has top and bottom surfaces;

applying a second tape to the bottom surface of the second leadframe panel;

placing a plurality of integrated circuits (IC) within respective ones of the die receiving areas of the die paddles of the second leadframes of the second leadframe panel, each of the ICs having a top surface with a plurality of bonding pads around a perimeter thereof and a bottom surface, wherein the bottom surfaces of the ICs are attached to the second tape;

placing the first and second leadframe panels in facing relationship such that the bonding pads of the ICs contact respective ones of the leads of the first leadframes, thereby electrically connecting the ICs and the first leadframes;

forming a mold compound between the first and second leadframe panels such that the mold compound covers at least the top surface of the second leadframe panel, the top surface of the ICs, and the electrical connections;

removing the first and second tapes from the first and second leadframe panels so that the first side of the first leadframe panel and the bottom surface of the second leadframe panel are exposed; and performing a singulation operation that separates the plurality of first and second leadframes from the leadframe panels and into individual packaged devices.

Figure 2:
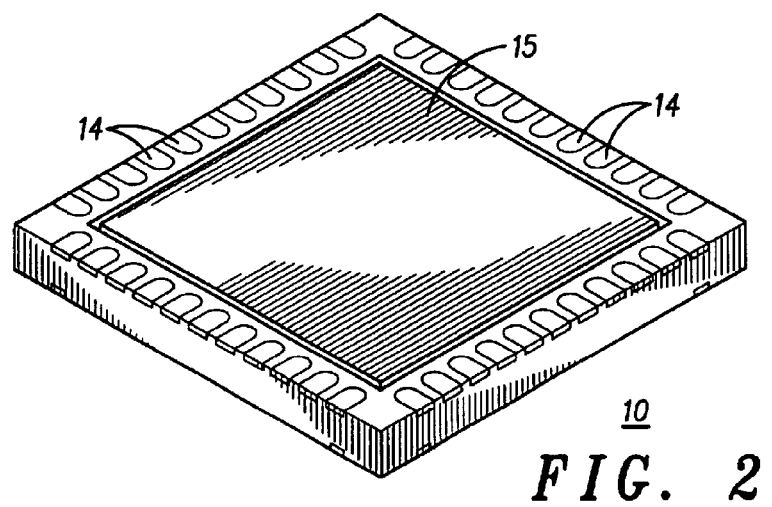
FIG. 2 is a bottom perspective view of the packaged semiconductor device of FIG. 1.

Referring now to FIGS. 1 and 2, enlarged top and bottom perspective views of an embodiment of a packaged semiconductor device 10 in accordance with the present invention are shown. In the embodiment shown, the packaged device 10 houses an integrated circuit (IC) 12 that has an exposed surface (FIG. 1). The integrated circuit 12 may be of a type known to those of skill in the art, such as a circuit formed on and cut from a silicon wafer. Typical circuit (die) sizes may range from 2 mm×2 mm to 12 mm×12 mm and have a thickness ranging from about 3 mils to about 21 mils. The packaged device 10 is known as a QFN (Quad Flat No-Lead) package and may range in size from about 3×3 mm to about 12×12 mm. However, it will be understood by those of skill in the art that the circuit and package sizes may vary and that the shape of the packaged device may vary too.

The IC 12 may be connected to other circuits or devices via leads 14 that are exposed on the bottom and side surfaces of the packaged device 10. In the embodiment shown in FIG. 1, a bottom surface of the IC 12 is exposed. FIG. 2 shows the bottom side of the packaged device 10. On the bottom side, in the embodiment shown, a ground plane 15 is exposed. However, as discussed in more detail below, the ground plane 15 is optional. In an alternative embodiment, on the bottom side, only the leads 14 are exposed.

Figure 3:
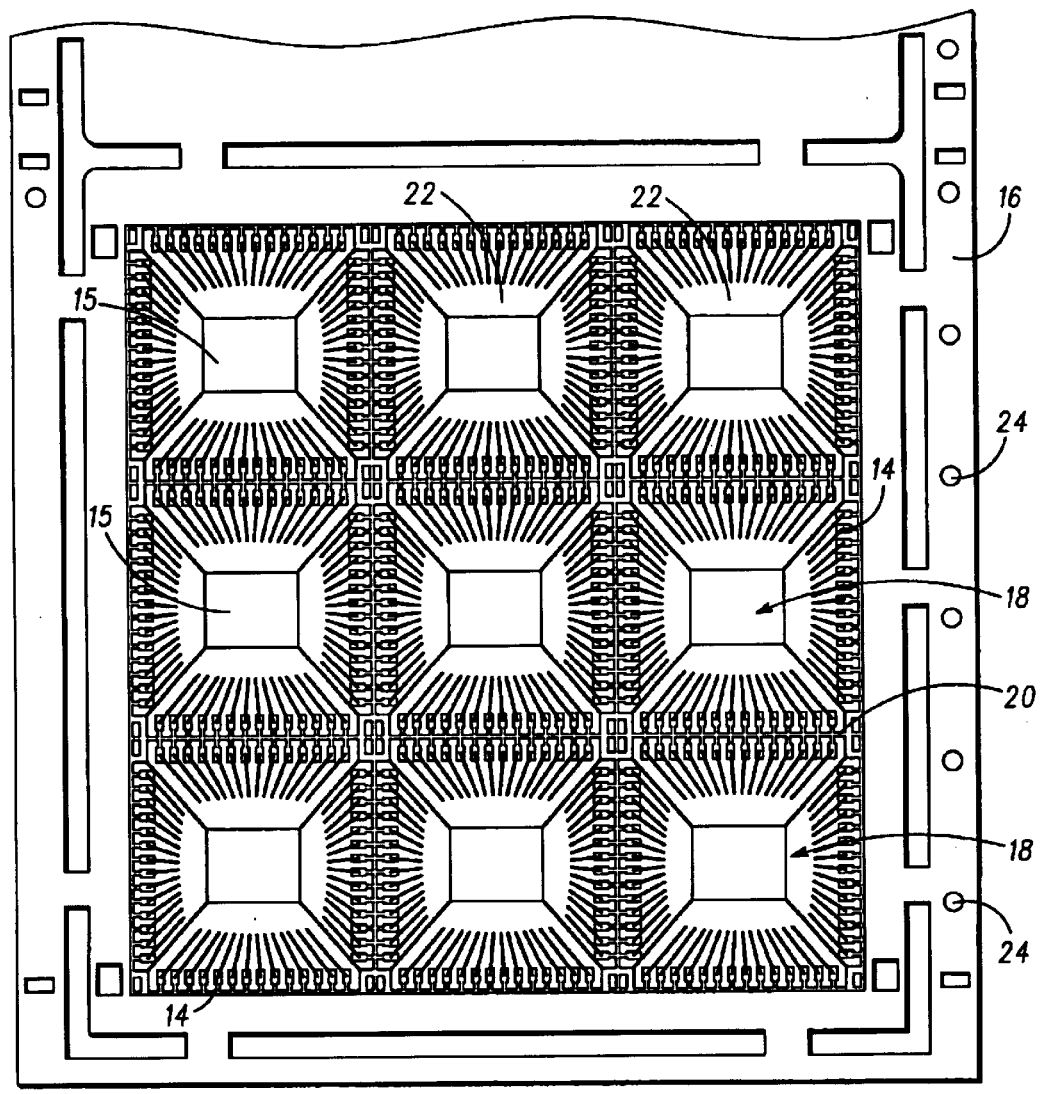
FIG. 3 is an enlarged top plan view of a portion of a first leadframe panel in accordance an embodiment of the present invention.

Referring now to FIG. 3, an enlarged top plan view of a portion of a first leadframe panel 16 is shown. The first leadframe panel 16 includes a plurality of first leadframes 18 connected together with first connection bars 20. In the embodiment shown, the first leadframe panel 16 comprises a 3×3 matrix of the first leadframes 18. However, the first leadframe panel 16 may have more or fewer of the first leadframes 18. Each of the first leadframes 18 has a perimeter (i.e. the first connection bars 20) that defines a cavity 22 and a plurality of leads 14 extending inwardly from the perimeter. The cavity 22 is shown in dashed lines. The embodiment shown includes the ground plan 15, which is located inside the cavity 22. The ground plane 15 provides common electrical grounding for the IC 12. The grounding plane 15 also provides a solderable area that further enhances the board level solder joint strength. As previously discussed, the ground plane 15 is an optional feature. The size and shape, as well as the number of leads 14, of the first leadframe is determined based on the size, shape and number of bonding pads of the IC 12. Although the leads 14 are shown as being of generally the same length and width, the leads 14 may vary in length and width. For example, leads used for power and ground may be wider than signal leads.

The first leadframe panel 16 has first and second sides. In FIG. 3, the first side is shown. The first leadframe panel 16 also includes a plurality of spaced first holes 24 located along its perimeter. The first leadframe panel 16 is preferably formed of a metal or metal alloy and has a first predetermined thickness. For example, the first leadframe panel 16 may comprise copper and be formed by cutting, stamping or etching as known by those of skill in the art. In the presently preferred embodiment, the first leadframe panel 16 is formed of copper that is pre-plated with tin.

Figure 4:
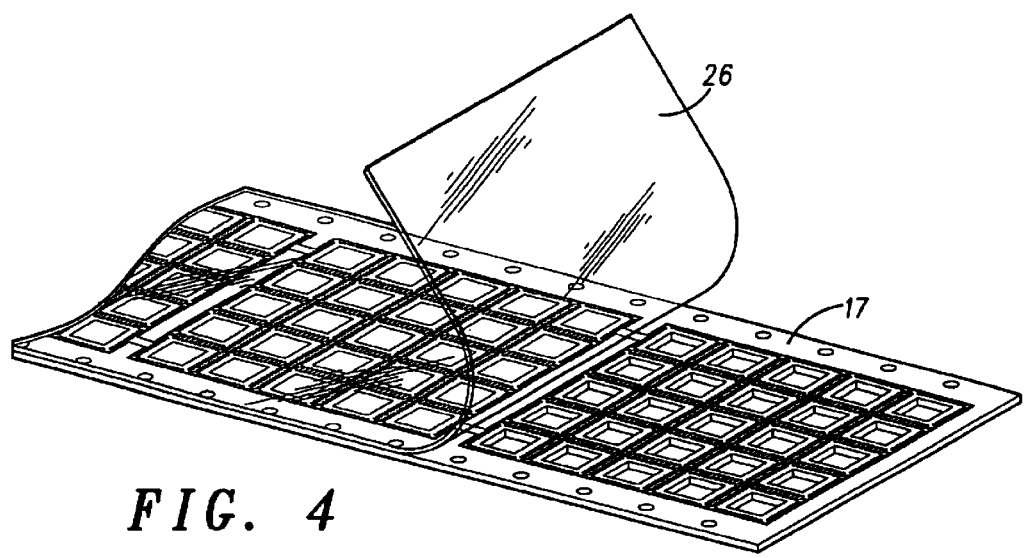
FIG. 4 is a perspective view of a first tape being applied to the first leadframe panel of FIG. 3.

FIG. 4 shows another first leadframe panel 17 having three 5×5 matrices of the first leadframes 18. Otherwise, the first leadframe panel 17 is the same as the first leadframe panel 16. In forming the packaged device 10, the first leadframe panel 17 (or 16) has a first tape 26 applied to a first side thereof. The first tape 26 is of a type known to those of skill in the art typically used in semiconductor packaging operations that can withstand high temperatures. The first tape 26 has an adhesive or glue on one side that allows it to stick to the first leadframe panel 17.

Figure 5:
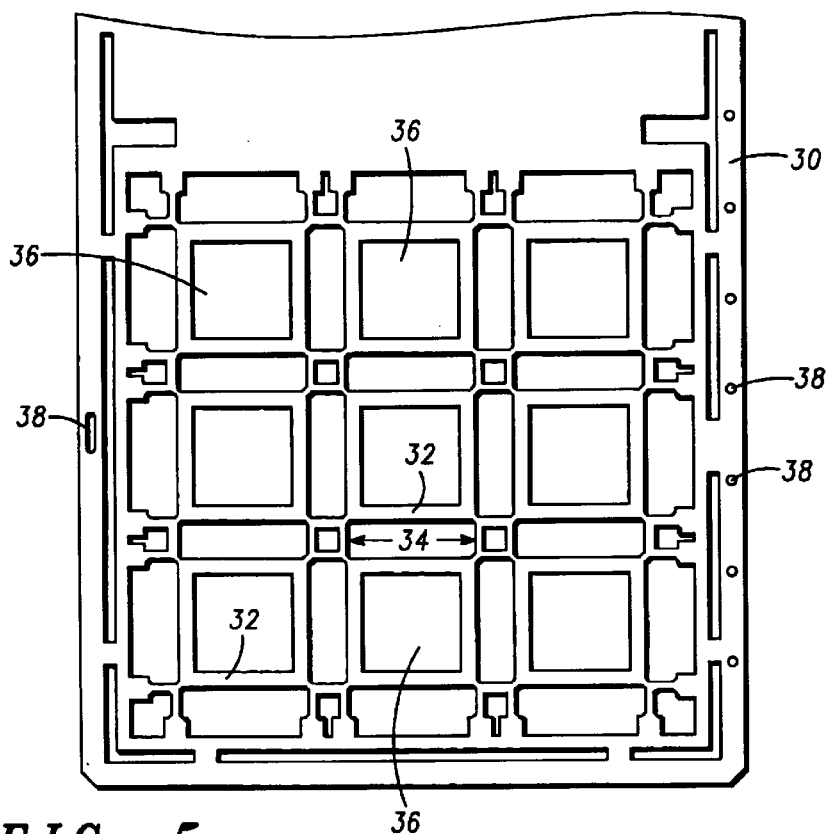
FIG. 5 is an enlarged top plan view of a portion of a second leadframe panel in accordance an embodiment of the present invention.

FIG. 5 is an enlarged top plan view of a portion of a second leadframe panel 30 in accordance with the present invention. The second leadframe panel 30 includes a plurality of second leadframes 32. FIG. 5 shows a portion of the second leadframe panel 30 including a 3×3 matrix of the second leadframes 32. However, the second leadframe panel 30 may include a number of various size matrices and is not limited to 3×3. The second leadframes 32 are connected together with second connection bars 34. Each of the second leadframes 32 comprises a die paddle surrounding a cavity or die receiving area 36. The second leadframes 32 also have first and second or top and bottom surfaces and a second thickness. The die receiving area 36 is sized and shaped to receive the IC 12. Thus, if the IC 12 is rectangular shaped, then it is preferred that the die receiving area 36 is rectangular shaped too. The die receiving area 36 may be slightly larger than the IC 12. As shown in FIG. 1, the IC 12 fits snugly within the die receiving area 36. As will be understood by those of skill in the art, the IC 12 may be placed within the die receiving area 36 using commercially available die placement equipment. Although the second leadframe 32 has a cavity for receiving the IC 12, the second leadframe 32 could have a solid die paddle area such the IC 12 would be placed on (and attached to) the die paddle. Like the first leadframe panel 16, the second leadframe panel 30 also includes a plurality of spaced, second holes 38 located along its perimeter. The holes 38 may be formed by any suitable method, such as punching. As discussed in more detail below, when the first and second leadframe panels 16 and 30 are stacked, the first holes 24 line up with the second holes 38.

Figure 6:
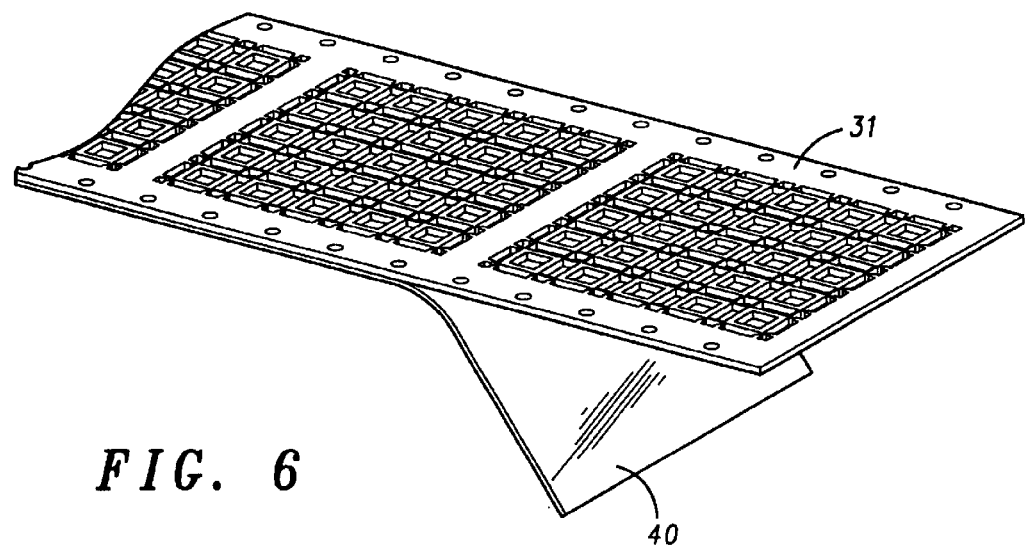
FIG. 6 is a perspective view of a second tape being applied to the second leadframe panel of FIG. 5.

FIG. 6 shows a second leadframe panel 31 having three 5×5 matrices of the second leadframes 32. Otherwise, the second leadframe panel 31 is the same as the second leadframe panel 30 (FIG. 5). In forming the packaged device 10, the second leadframe panel 31 (or 30) has a second tape 40 applied to a bottom side thereof. The second tape 40, like the first tape 26, is of a type known to those of skill in the art typically used in semiconductor packaging operations that can withstand high temperatures. The second tape 40 has an adhesive or glue on one side that allows it to stick to the second leadframe panel 31. The second tape 40 protects the bottom surface of the second leadframe panel 30 or 31 from mold resin bleeding (described below). In a preferred embodiment, the second tape 40 also holds the ICs 12 inside the die receiving areas 36 of the second leadframes 32.

Like the first leadframe panel 16, the second leadframe panel 30 is preferably formed of a metal or metal alloy, and may be formed by cutting, stamping or etching as known by those of skill in the art. For more complex and higher density leadframes, a chemical etching method is preferred. As is understood by those of skill in the art, the etching method uses an artwork mask to define the detailed pattern of the leadframe and then the unmasked portion of the metal is etched away. A plating mask is used to mask out no-plating zones, if any, and then the unmasked portions are plated with metal layers with a plating process. Rinsing and cleaning steps are performed between processes. Such masking, etching, plating, rinsing and cleaning processes are well known to those of skill in the art.

Figure 7:
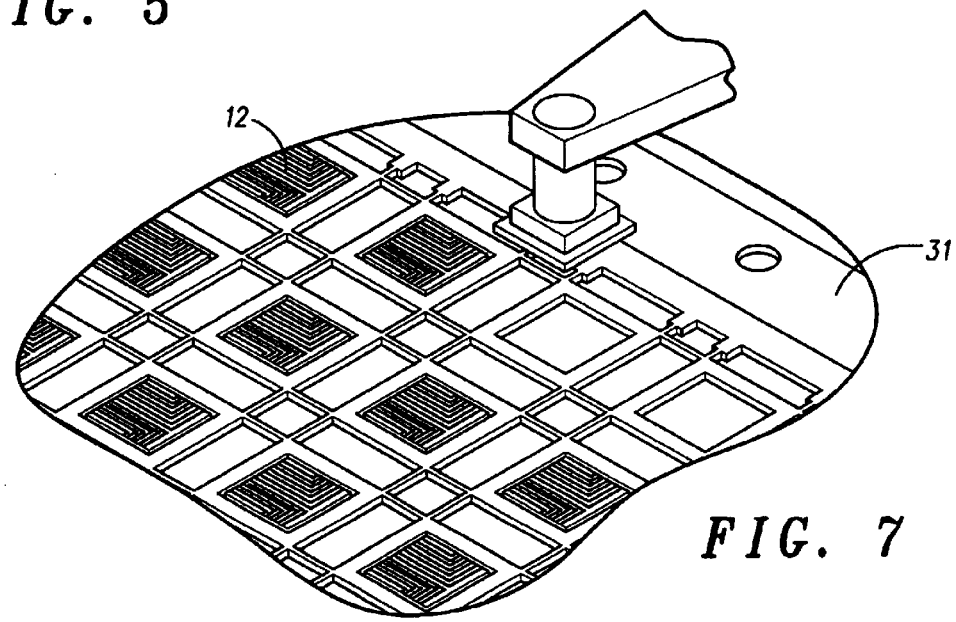
FIG. 7 is a perspective view of an integrated circuit die being placed in a die receiving area of the second leadframe panel of FIG. 5.

FIG. 7 shows a step of placing the ICs 12 in the die receiving areas 36 of the second leadframes 32. If the die receiving area 36 is a cavity, then the IC 12 is placed inside the cavity where it adheres to the surface of the second tape 40. That is, a bottom surface of the IC 12 adheres to the glue or adhesive of the second tape 40. If the die receiving area 36 is a location within the second leadframe 32, but not a cavity (i.e., a solid die paddle), then an adhesive or die attach material is used to secure the IC 12 to the die paddle of the second leadframe 32. The IC 12 has a first or bottom side that adheres to either the second tape 40 or the die paddle and a second or topside that has a plurality of bonding pads spaced around its perimeter. As previously discussed, currently available pick and place equipment is able to place integrated circuits in predetermined locations.

Figure 8:
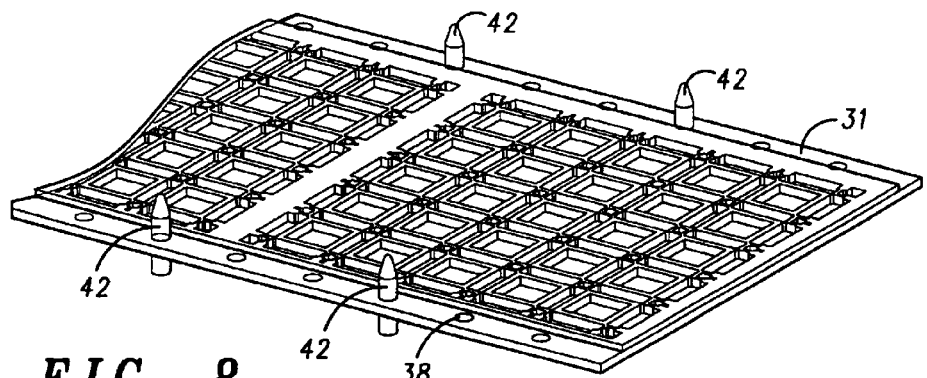
FIG. 8 is a perspective view of guide pins being inserted into holes of the second leadframe panel of FIG. 5 in accordance with an embodiment of the invention.

After the second leadframe panel 31 is populated with ICs 12, the first and second leadframe panels 17 and 31 are placed in facing relationship such that the bonding pads of the ICs 12 contact respective ones of the leads 14 of the first leadframes 18 such that the bonding pads make an electrical connection with the leads 14. FIG. 8 shows the second leadframe panel 31 with guide pins 42 inserted in the second holes 38. The guide pins 42 will extend into the first holes 24 of the first leadframe panel 17 and assist in accurately aligning the first and second leadframe panels 17 and 31 with each other.

Figure 9:
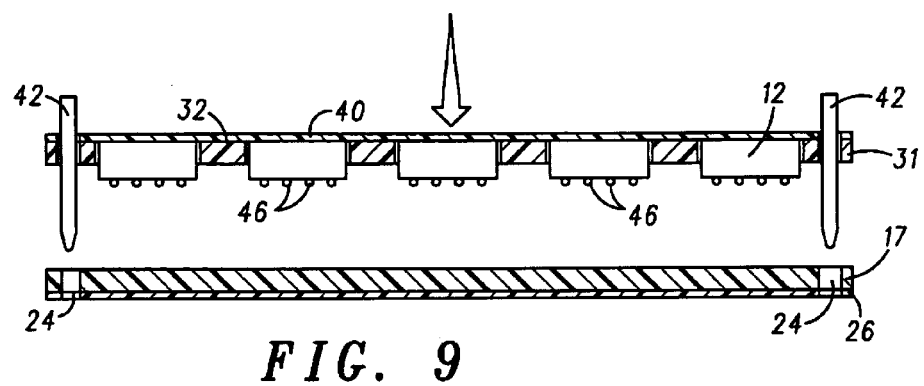
FIG. 9 is an enlarged cross-sectional view of the first and second leadframe panels being stacked in accordance with an embodiment of the present invention.
Figure 10:
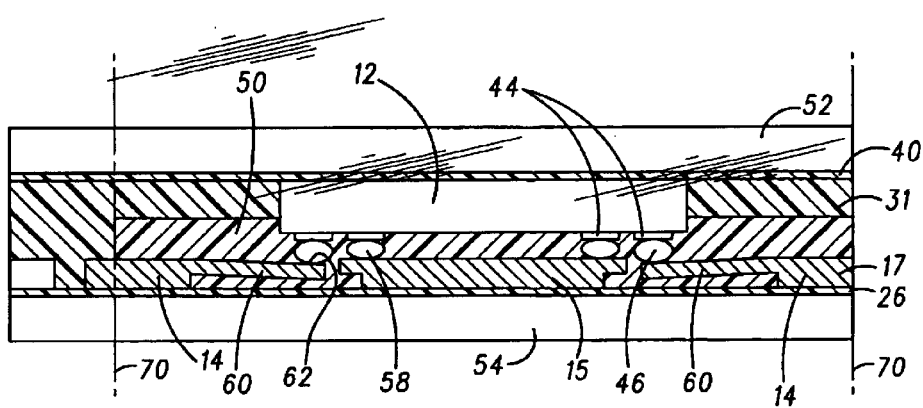
FIG. 10 is an enlarged cross-sectional view illustrating a molding step in accordance with an embodiment of the invention.

Referring now to FIGS. 9 and 10, the first and second leadframe panels 17 and 31 are placed in facing relationship such that the bonding pads of the ICs 12 contact respective ones of the leads 14 of the first leadframes 18, thereby electrically connecting the ICs 12 and the first leadframes 18. FIG. 9 is an enlarged cross-sectional view of the first and second leadframe panels 17 and 31 being aligned, one over the other, such that the bonding pads on the top surfaces of the ICs 12 will contact with the leads 14 of the first leadframes 18. FIG. 10 is an enlarged cross-sectional view of one of the ICs 12 after it has been placed in contact with a corresponding one of the leadframes 18 and placed in a mold prior to a molding or encapsulation procedure. The guide pins 42 extend through the first and second holes 24 and 38 in the first and second leadframe panels 17 and 31, ensuring precise alignment of the panels.

The leads 14 may directly contact the bonding pads 44 or as is presently preferred, conductive balls 46 are interposed between respective ones of the bonding pads 44 of the ICs 12 and the leads 14 of the first leadframes 18. The leads 14 are thus electrically coupled to the bonding pads 44 via the conductive balls 46. Preferably, the conductive balls 46 are attached to the bonding pads 44 prior to placing the first and second leadframe panels 17 and 31 in facing relationship. The conductive balls 46 may be formed of any material that readily conducts an electrical signal. However, it is preferred that the conductive balls 46 are formed of tin solder. Another suitable material is gold. The conductive balls 46 may be attached to the bonding pads 44 via electroplating, screen-printing, or gold ball bonding.

Figure 15:
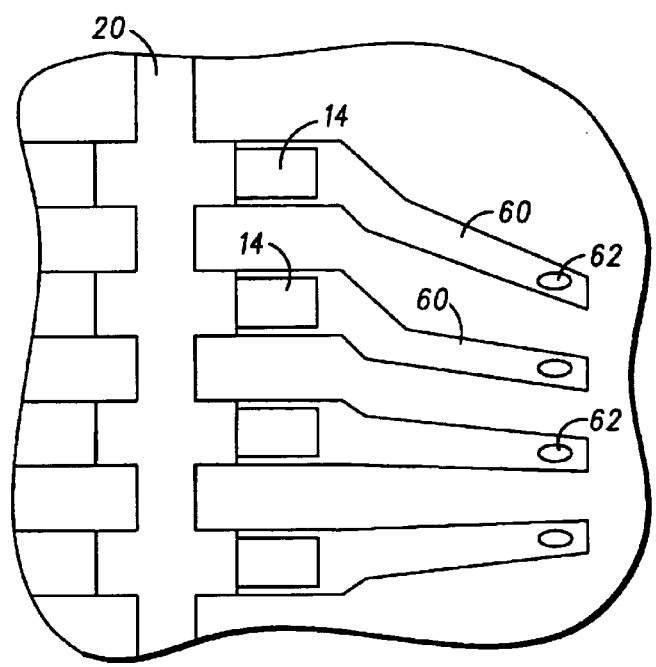
FIG. 15 is an enlarged top plan view of a lead finger of a first leadframe of the leadframe panel of FIG. 3 in accordance with an embodiment of the invention.

Referring to FIG. 15, a top plan view of four of the leads 14 projecting from one of the connection bars 20 are shown. Each of the leads 14 preferably includes a partially etched portion 60 and an etched trench or groove 62 near a distal end of the lead 14. The trench or groove portion 62 aids in aligning and securing the conductive ball 46 with the lead 14. The etched portions 60 of the leads 14 allow the leads 14 to bend or deform when the balls 46 are pressed thereagainst. Pre-plating of the first leadframe 18 with tin facilitates reflow of the conductive balls 46 without the application of solder paste or flux.

After the two leadframe panels 17 and 31 are placed in facing relationship, as shown in FIG. 10, the stacked leadframes 17 and 31 may be passed through a reflow oven so that the pre-plated tin on the leads 14 will melt and form a solder joint with the conductive balls 46. This is an optional step, as the electrical connections between the conductive balls 46 and the leads 14 can be secured by a mold compound (e.g., the mold compound 50 described below) during a molding or encapsulation step.

After the two leadframe panels 17 and 31 are placed in facing relationship, as shown in FIG. 10, a molding operation is performed for forming a mold compound between the first and second leadframe panels 17 and 31 such that a mold compound 50 injected between the leadframe panels 17 and 31 covers at least the top surface of the second leadframe panel 17, the top surface of the ICs 12, and the electrical connections. The mold compound 50 may comprise a plastic as is commonly used in packaged electronic devices. Top and bottom mold pieces 52 and 54 press the first and second leadframe panels 17 and 31 together to insure good electrical connection between the bonding pads 44 and the leads 14 via the conductive balls 46. As can be seen in the drawings, the first and second leadframes 17 and 31 are electrically isolated from each other.

Figure 11:
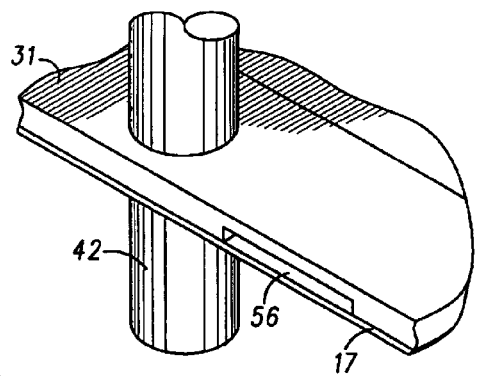
FIG. 11 is an enlarged perspective view of a portion of one of the first and second leadframe panels in accordance with an embodiment of the present invention.

Referring to FIG. 11, one of both of the leadframe panels 17 and 31 may be partially etched to allow for injecting the mold compound 50 between the leadframe panels 17 and 31. FIG. 11 shows the second leadframe panel 31 being partially etched to form a passage 56 for the mold compound 50. The first and second tapes 26 and 40 prevent resin or mold compound bleeding during a molding or encapsulation process.

Figure 12:
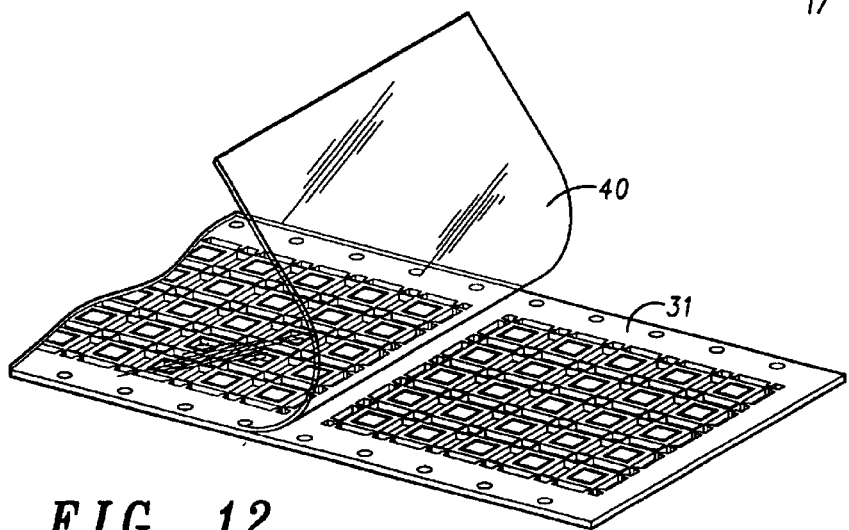
FIG. 12 is a perspective view illustrating a de-taping procedure in accordance with an embodiment of the invention.

Referring to FIG. 12, after the molding operation is completed, the first tape 26 is removed from the first leadframe panel 17 and the second tape 40 is removed from the second leadframe panel 31. The tapes 26 and 40 may be removed manually or with automated equipment that is presently commercially available.

Figure 13:
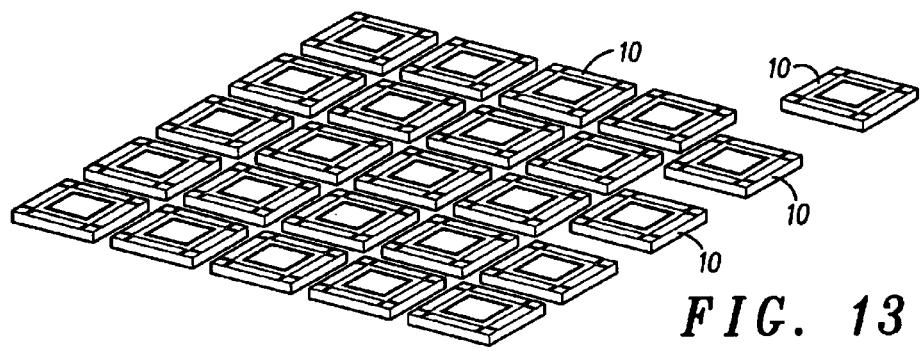
FIG. 13 is a perspective view illustrating a dicing procedure in accordance with an embodiment of the present invention.

The first and second leadframes 18 and 32 are then separated from other ones of the first and second leadframes by performing a dicing or singulation operation, as shown in FIG. 13, to form the individual packaged devices 10. Dicing and saw singulation processes are well known in the art. FIG. 10 shows the locations with dashed lines 70 along which the first and second leadframes 18 and 22 are cut.

Figure 14:
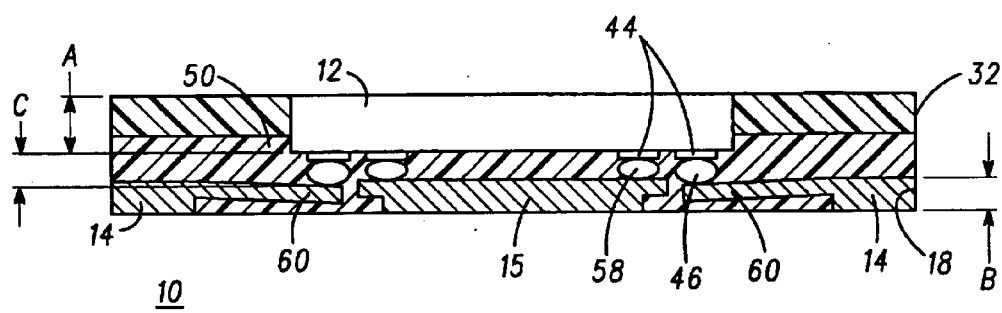
FIG. 14 is an enlarged cross-sectional view of the semiconductor device of FIG. 1.

FIG. 14 is an enlarged cross-sectional view of a finished device 10. In an example embodiment, a packaged device was constructed using an integrated circuit 12 having a thickness of about 11 mils as indicated at A. The first leadframe 18 had a thickness of about 8 mils, as indicated at B and the conductive balls 46 had a thickness or diameter of about 3 mils as indicated at C. The three thicknesses, A, B and C (11+8+3) add up to 22 mils. However, due to the pressure exerted on the device 10 during the molding operation by the top and bottom molds 52 and 54, the device 10 has an overall thickness of about 20 mils. That is, a mechanical compressive force acts on (and continues to act on) the leads 14. The portion of the lead 14 with the partial etch feature 60 is bent downward and has a spring back force that continues to push on or press the conductive balls 46 against the bonding pads 44. This mechanical spring back force enhances the joint strength between the conductive balls 46, the leads 14, and the bonding pads 44.

The first and second leadframes 18 and 32 may be of different thicknesses. For example, for power circuits that generate a lot of heat, the second leadframe 32 to which an IC may be attached (non-cavity type die paddle) can be used as a heat sink. In such a case, it is preferred that the second thickness is greater than the first thickness. The first leadframe 18 could be thinner to facilitate saw singulation. Alternatively, as shown in FIG. 14, the second leadframe 32 may be thicker than the first leadframe 18. FIG. 14 also shows the ground plane 15. The IC 12 may be electrically connected with the ground plane 15 with conductive balls 58 that have a smaller diameter than the conductive balls 46.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, a leadframe having more than two parts could be formed, such as having a die paddle formed of two or more component parts. It is understood, therefore, that this invention is not limited to the particular embodiments disclosed, but covers modifications within the spirit and scope of the present invention as defined by the appended claims.

What is claimed is:

1. A method of packaging semiconductor device, comprising the steps of:

providing a first leadframe having a perimeter that defines a cavity and a plurality of leads extending inwardly from the perimeter, wherein the first leadframe has first and second sides;

applying a first tape to the first side of the first leadframe;

providing a second leadframe having a die paddle, the die paddle having a die receiving area, the second leadframe having top and bottom surfaces;

applying a second tape to the bottom surface of the second leadframe;

attaching an integrated circuit (IC) to the die receiving area of the die paddle, the IC having a top surface with a plurality of bonding pads around a perimeter thereof and a bottom surfaces;

stacking the second leadframe on the first leadframe such that the plurality of IC bonding pads electrically contact respective ones of the plurality of leads of the first leadframe;

forming a mold compound over at least the top surface of the second leadframe, the top surface of the IC and the electrical contacts; and removing the first and second tapes from the first and second leadframes so that the first side of the first leadframe and the bottom surface of the second leadframe are exposed.

2. The method of packaging a semiconductor device of claim 1, further comprising the step of interposing a plurality of conductive balls between respective ones of the bonding pads of the IC and the leads of the first leadframe, wherein the leads of the first leadframe contact respective ones of the bonding pads of the IC by way of the conductive balls.

3. The method of packaging a semiconductor device of claim 2, wherein the conductive balls are attached to the IC bond pads prior to the stacking step.

4. The method of packaging a semiconductor device of claim 3, wherein the plurality of leads of the first leadframe are partially etched and the conductive balls are received within the etched portions of the leads.

5. The method of packaging a semiconductor device of claim 4, wherein the second leadframe is pressed against the first leadframe such that the conductive balls press against corresponding ones of the leads of the first leadframe, thereby bending the leads and causing a spring back force of the leads on the conductive balls that enhances a joint strength of the conductive balls and the leads.

6. The method of packaging a semiconductor device of claim 1, wherein the stacking step further comprises aligning the first and second leadframes with at least one guiding pin and at least one corresponding guiding hole in the first and second leadframes.

7. The method of packaging a semiconductor device of claim 1, wherein the die receiving area of the die paddle of the second leadframe comprises a central cavity, wherein the IC is placed within the central cavity such that the bottom surface of the IC adheres to the second tape, and wherein when the second tape is removed from the second leadframe, the bottom surface of the IC is exposed.

8. The method of packaging a semiconductor device of claim 1, further comprising the step of pre-plating the first leadframe with tin.

9. The method of packaging a semiconductor device of claim 1, wherein the mold compound forming step comprises injecting the mold compound between the first and second leadframes.

10. The method Of packaging a semiconductor device of claim 1, herein the first and second leadframes are electrically isolated from each other.

11. The method of packaging a semiconductor device of claim 10, wherein the first leadframe further comprises a ground plane located within the die receiving area, wherein one or more of the IC bonding pads is electrically connected to the ground plane.

12. A method of packaging a plurality of semiconductor devices, comprising the steps of:

providing a first leadframe panel, the first leadframe panel having a plurality of first leadframes, each of the first leadframes having a perimeter that defines a cavity and a plurality of leads extending inwardly from the perimeter, wherein the first leadframe panel has first and second sides;

applying a first tape to the first side of the first leadframe panel;

providing a second leadframe panel, the second leadframe panel including a plurality of second leadframes, each of the second leadframes including a die paddle having a die receiving area, wherein the second leadframe panel has top and bottom surfaces;

applying a second tape to the bottom surface of the second leadframe panel;

placing a plurality of integrated circuits (IC) within the die receiving areas of the die paddles of the second leadframes of the second leadframe panel, each of the ICs having a top surface with a plurality of bonding pads around a perimeter thereof and a bottom surface, wherein the bottom surfaces of the ICs are attached to the second tape;

placing the first and second leadframe panels in facing relationship such that the bonding pads of the ICS contact respective ones of the leads of the first leadframes, thereby electrically connecting the ICs and the first leadframes;

forming a mold compound between the first and second leadframe panels such that the mold compound covers at least the top surface of the second leadframe panel, the top surface of the ICs and the electrical connections;

removing the first and second tapes from the first side of the first leadframe panel and the bottom surface of the second leadframe panel so that the first sides of the first leadframes and the bottom surfaces of the second leadframes are exposed; and performing a singulation operation that separates the plurality of first and second leadframes from the leadframe panels and into individual packaged devices.

13. The method of packaging a semiconductor device of claim 12, further comprising the step of interposing a plurality of conductive balls between respective ones of the bonding pads of the ICs and the leads of the first leadframes, wherein the leads of the first leadframes contact respective ones of the bonding pads of the ICs by way of the conductive balls.

14. The method of packaging a semiconductor device of claim 13, wherein the conductive balls are attached to the leads prior to placing the first and second leadframe panels in facing relationship.

15. The method of packaging a plurality of semiconductor devices of claim 14, wherein the plurality of leads of the first leadframe are partially etched and the conductive balls are disposed within the etched portions of the leads.

16. The method of packaging a plurality of semiconductor devices of claim 15, wherein the first and second leadframes are pressed against each other such that the conductive balls press against the leads, thereby bending the leads and causing a spring back force on the conductive balls, said spring back force enhancing a joint strength between the leads and the conductive balls.

17. The method of packaging a plurality of semiconductor devices of claim 12, further comprising the step of aligning the first and second leadframe panels with a series of guiding pins placed in corresponding guiding holes located in the first and second leadframe panels.

18. The method of packaging a plurality of semiconductor devices of claim 12, wherein the first and second leadframe panels are formed of a metal or metal alloy.

19. The method of packaging a plurality of semiconductor devices of claim 18, wherein first and second leadframe panels are formed of copper.

20. The method of packaging a plurality of semiconductor devices of claim 19, wherein first leadframe panel is pre-plated with tin.

21. The method of packaging a plurality of semiconductor device of claim 12, wherein the mold compound forming step comprises injecting the mold compound between the first and second leadframe panels.

22. The method of packaging a plurality of semiconductor devices of claim 12, wherein the first leadframes of the first leadframe panel each include a ground plane located within the die receiving area, and wherein one or sore of the IC bonding pads is electrically connected to the ground plane.

* * * * *

UNITED STATES PATENT AND TRADEMARK OFFICE
CERTIFICATE OF CORRECTION

PATENT NO. : 6,867,072 B2
DATED : March 15, 2005
INVENTOR(S) : Hei Ming Shiu et al.

It is certified that error appears in the above-identified patent and that said Letters Patent is hereby corrected as shown below:

<u>Column 8,</u>
Line 13, add -- a -- after "packaging".
Line 29, change "surfaces;" to -- surface; --.

<u>Column 9,</u>
Line 13, change "Of" to -- of --.
Line 14, change "herein" to -- wherein --.
Line 46, change "ICS" to -- ICs --.

<u>Column 10,</u>
Line 52, change "sore" to -- more --.

Signed and Sealed this

Twenty-fifth Day of April, 2006

JON W. DUDAS
*Director of the United States Patent and Trademark Office*